(12) United States Patent
Ahn et al.

(10) Patent No.: US 9,368,236 B2
(45) Date of Patent: Jun. 14, 2016

(54) SEMICONDUCTOR MEMORY APPARATUS AND TEST METHOD THEREOF

(71) Applicant: SK hynix Inc., Icheon-si Gyeonggi-do (KR)

(72) Inventors: Chang Yong Ahn, Icheon-si (KR); Yoon Jae Shin, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 44 days.

(21) Appl. No.: 14/479,696

(22) Filed: Sep. 8, 2014

(65) Prior Publication Data
US 2015/0357048 A1 Dec. 10, 2015

(30) Foreign Application Priority Data
Jun. 5, 2014 (KR) .................. 10-2014-0068218

(51) Int. Cl.
| | | |
|---|---|---|
| G11C 7/00 | (2006.01) | |
| G11C 29/38 | (2006.01) | |
| G11C 29/12 | (2006.01) | |
| G11C 29/48 | (2006.01) | |

(52) U.S. Cl.
CPC ............ *G11C 29/38* (2013.01); *G11C 29/1201* (2013.01); *G11C 29/12005* (2013.01); *G11C 29/48* (2013.01)

(58) Field of Classification Search
CPC ............ G06F 11/3688; G06F 11/1076; G06F 11/004; G06F 11/0751; G06F 11/2273; G06F 11/2289; G06F 11/3672; G11C 29/08; G11C 29/12; G11C 2029/4402; G11C 29/36; G11C 2029/2602; G11C 29/4401; G11C 2207/2254; G11C 29/44; G11C 29/56008; G11C 29/00; G11C 29/38; G11C 29/12005
USPC ................ 365/201, 185.18, 185.23, 189.011, 365/189.14, 189.15, 189.16, 189.1, 7, 365/189.05, 189.07, 221
See application file for complete search history.

(56) References Cited

U.S. PATENT DOCUMENTS

| | | | | |
|---|---|---|---|---|
| 5,488,583 A * | 1/1996 | Ong | ................... | G11C 7/1006 365/201 |
| 6,324,666 B1 * | 11/2001 | Nakamoto | ....... | G01R 31/31917 365/201 |
| 6,990,617 B2 * | 1/2006 | In | ......................... | G11C 7/1078 365/201 |
| 7,355,911 B2 * | 4/2008 | Hartmann | ............... | G11C 29/38 365/185.09 |
| 2007/0011510 A1 * | 1/2007 | Hartmann | ............... | G11C 29/38 741/718 |
| 2007/0109888 A1 * | 5/2007 | Baker | .................... | G11C 29/38 365/201 |
| 2011/0002169 A1 * | 1/2011 | Li | ........................ | G11C 29/808 365/185.09 |

FOREIGN PATENT DOCUMENTS

| | | |
|---|---|---|
| KR | 1020050075192 B1 | 8/2005 |
| KR | 1020110034980 A | 4/2011 |

* cited by examiner

*Primary Examiner* — Fernando Hidalgo
(74) *Attorney, Agent, or Firm* — William Park & Associates Ltd.

(57) ABSTRACT

A semiconductor memory apparatus may include a read/write circuit unit configured to receive an external voltage, to read data from a memory cell array, and to generate a pre-read signal, while an internal voltage is generated during a test mode, and a controller configured to selectively drive a write circuit unit in response to the pre-read signal.

18 Claims, 5 Drawing Sheets

SEMICONDUCTOR MEMORY APPARATUS AND TEST METHOD THEREOF

CROSS-REFERENCES TO RELATED APPLICATION

The present application claims priority under 35 U.S.C. §119(a) to Korean application number 10-2014-0068218, filed on Jun. 5, 2014, in the Korean Intellectual Property Office, which is incorporated herein by reference in its entirety.

BACKGROUND

1. Technical Field

Various embodiments relate to a semiconductor apparatus, and more particularly, to a semiconductor memory apparatus and a test method thereof.

2. Related Art

Advances in technology have led to increases in integration degree and capacities of semiconductor memory apparatuses. This has led to an increase in the challenges faced during the fabrication process.

In many cases, following the fabrication of a semiconductor memory apparatus, a test process is performed to detect defective cells in the semiconductor memory apparatus.

The test process may be performed at a wafer level or at a package level. The increases in degree of integration and capacity of the semiconductor memory apparatuses have led to an increase in the number of test target memory cells per wafer or per packaged chip.

SUMMARY

In an embodiment, a semiconductor memory apparatus may include a read/write circuit unit configured to receive an external voltage, to read data from a memory cell array, and to generate a pre-read signal while an internal voltage is generated during a test mode, and a controller configured to selectively drive a write circuit unit in response to the pre-read signal.

In an embodiment, a semiconductor memory apparatus may include an internal voltage generator configured to receive a first external voltage through a first pad and generate an internal voltage, a read/write circuit configured to generate a pre-read signal by reading data from a memory cell in a memory cell array in response to a second external voltage applied through a second pad during a test mode, and driven in response to a write control signal reflecting write circuit unit select information, and a controller configured to generate the write control signal reflecting the write circuit unit select information according to a comparison result between the pre-read signal and a test write signal during the test mode.

In an embodiment, a test method of a semiconductor memory apparatus including a memory cell array, a read/write circuit, an internal voltage generator, and a controller includes generating an internal voltage as a first external voltage is applied to the internal voltage generator through a first pad, during a test mode, generating, from the read/write circuit, a pre-read signal by reading data from memory cells in the memory cell array in response to the second external voltage, as a second external voltage is applied through a second pad, during the test mode, generating, from the controller, a write control signal reflecting write circuit unit select information according to a comparison result between the pre-read signal and a test write signal, and writing, by the read/write circuit, test write data to the memory cell array in response to the write control signal.

DETAILED DESCRIPTION

A semiconductor memory apparatus and a test method thereof will be described below with reference to the accompanying drawings.

Figure 1:
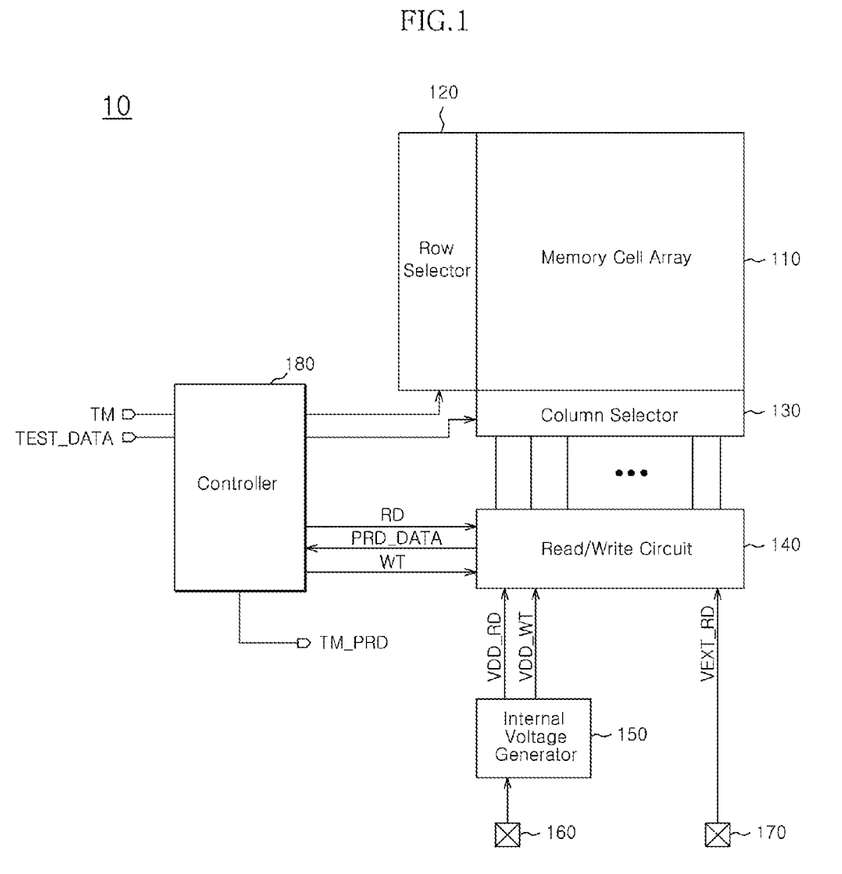
FIG. 1 is a block diagram representation of an embodiment of a semiconductor memory apparatus.

FIG. 1 is a block diagram representation of an embodiment of a semiconductor memory apparatus 10.

The semiconductor memory apparatus 10 may include a memory cell array 110, a row selector 120, a column selector 130, a read/write circuit 140, an internal voltage generator 150, a first pad 160, a second pad 170, and a controller 180.

The memory cell array 110 may include a plurality of memory cells electrically coupled between a plurality of bit lines and a plurality of word lines. Each of the memory cells may include one of a volatile memory cell and a nonvolatile memory cell.

The row selector 120 may be electrically coupled to the memory cell array 110 through the plurality of word lines. The row selector 120 may select a word line in response to a row select control signal received from the controller 180 and an address signal received from a device external to the semiconductor memory apparatus 10. Each of memory cells that are electrically coupled to the selected word line may receive a voltage associated with an operation mode.

The column selector 130 may be electrically coupled to the memory cell array 110 through the plurality of bit lines. The column selector 130 may select a bit line based on a column select control signal received from the controller 180 and an address signal received from a device external to the semiconductor memory apparatus 10. Each of memory cells that are electrically coupled to the selected bit line may receive a voltage associated with an operation mode.

The read/write circuit 140 may include a plurality of write circuit units having a write driver and a plurality of read circuit units having a sense amplifier. The read/write circuit 140 may operate in accordance with a write control signal WT and/or a read control signal RD received from the controller 180. Each of the write circuit units may be configured to write data to a selected memory cell of the memory cell array 110 in response to the write control signal WT during a write operation. Each of the read circuit units may be configured to read data stored in a selected memory cell of the memory cell array 110 in response to the read control signal RD during a read operation.

The internal voltage generator 150 may generate an internal voltage in response to a first external voltage received via the first pad 160. The internal voltage generator 150 may generate a test read voltage VDD_RD and/or a test write voltage VDD_WT when in test mode. The first pad 160 may, for example, include a power supply pad. The internal voltage generator 150 receives the first external voltage and generates the test voltage VDD_RD or VDD_WT. The generation of the test voltage VDD_RD or VDD_WT may take several μs.

The second pad 170 may receive a second external voltage VEXT_RD and provide the received voltage to the read/write circuit 140 during the test mode. The second pad 170 may include any one of data input/output pads and a power supply pad and may be provided separately.

When the second external voltage VEXT_RD is received at the second pad 170 and the read control signal RD received from the controller 180 is enabled, the read circuit unit of the read/write circuit 140 may read data from the memory cells forming the memory cell array 110, generate pre-read data PRD_DATA, and provide the generated pre-read data PRD_DATA to the controller 180.

When the pre-read data PRD_DATA is generated by the read/write circuit 140, the controller 180 may compare the pre-read data PRD_DATA to test write data TEST_DATA, and generate a write control signal WT reflecting the result of the comparison. In an embodiment, the controller 180 may generate a write control signal WT that reflects the write circuit unit selection information, to drive the write circuit unit electrically coupled to a memory cell when the pre-read data PRD_DATA is different from the test data TEST_DATA.

In an embodiment, during an internal test voltage generation period when the first external voltage received via the first pad 160 is generated as the internal test voltage VDD_RD or VDD_WT by the internal voltage generator 150, a pre-read operation may be performed. During the pre-read operation, the read/write circuit 140 may generate pre-read data PRD_DATA using the second external voltage received via the second pad 170 and provide the generated data to the controller 180. In an embodiment, during the internal test voltage generation period, a write circuit unit selection operation may be performed in addition to the pre-read operation. During the write circuit unit selection operation, the controller 180 may compare the pre-read data PRD_DATA to the test write driver TEST_DATA, and generate the write control signal WT according to the result of the comparison.

During the internal test voltage generation period that typically takes several μs, data stored in each of the memory cells of the cell array 110 may be read through the pre-read operation. The read data obtained through the pre-read operation and the test write data TEST_DATA may be compared to generate the write control signal WT such that the test write data TEST_DATA is written to a memory cell where the data in the memory cell different is from the test write data TEST_DATA.

When the write control signal WT is generated, the test write voltage VDD_WT generated by the internal voltage generator 150 may be supplied to a write circuit unit of the read/write circuit 140 to write the test write data TEST_DATA into the write target memory cell. The test read voltage VDD_RD may be supplied to the read circuit units of the read/write circuit 140 to read data from all of the memory cells in the memory cell array 110 to verify the test result.

Figure 2:
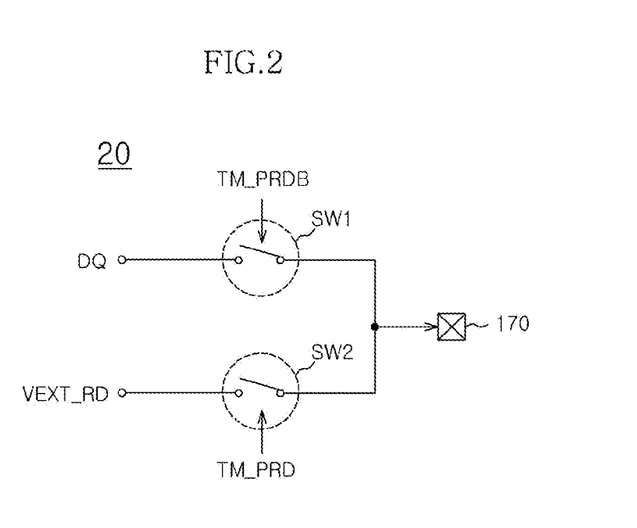
FIG. 2 is a circuit diagram representation of an embodiment of a second external voltage application circuit.

FIG. 2 is a circuit diagram representation of an embodiment of a second external voltage application circuit.

The second pad 170 may use one of the data input/output pads. In order to perform the pre-read operation during the test mode, the second external voltage application circuit 20 may include a first switch SW1 and a second switch SW2. The first switch SW1 may be driven by an inverted signal TM_PRDB of a pre-read signal TM_PRD to receive a data signal, and the second switch SW2 may be driven by the pre-read signal TM_PRD to receive the second external voltage VEXT_RD.

When the pre-read signal TM_PRD is enabled in the test mode, the second switch SW2 may be turned on to apply the second external voltage VEXT_RD to the second pad 170. In the other modes, the first switch SW1 may be turned on to operate the second pad 170 as a typical data input/output pad.

In an embodiment, the pre-read signal TM_PRD may have an enable state for a predetermined time, until the test mode signal TM is disabled after having been enabled. The pre-read signal TM_PRD may be generated by a circuit configured to generate a pulse that is enabled for a preset time by a logical combination of a delayed signal and an inverted delayed signal of the test mode signal TM.

Figure 3:
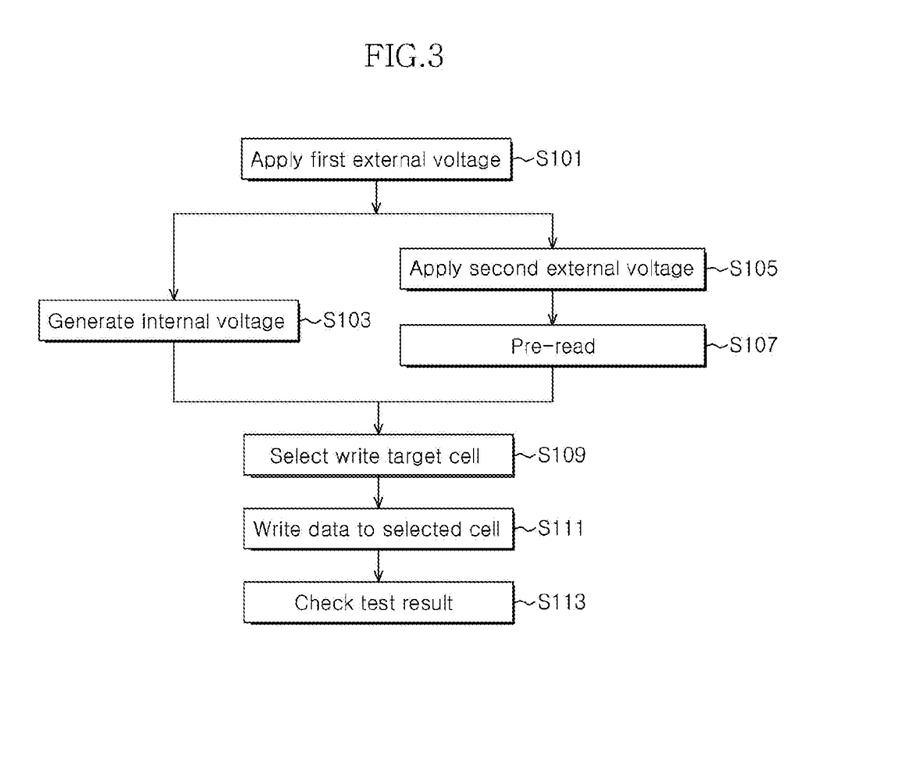
FIG. 3 is a flowchart representation of an embodiment of a test method.
Figure 4:
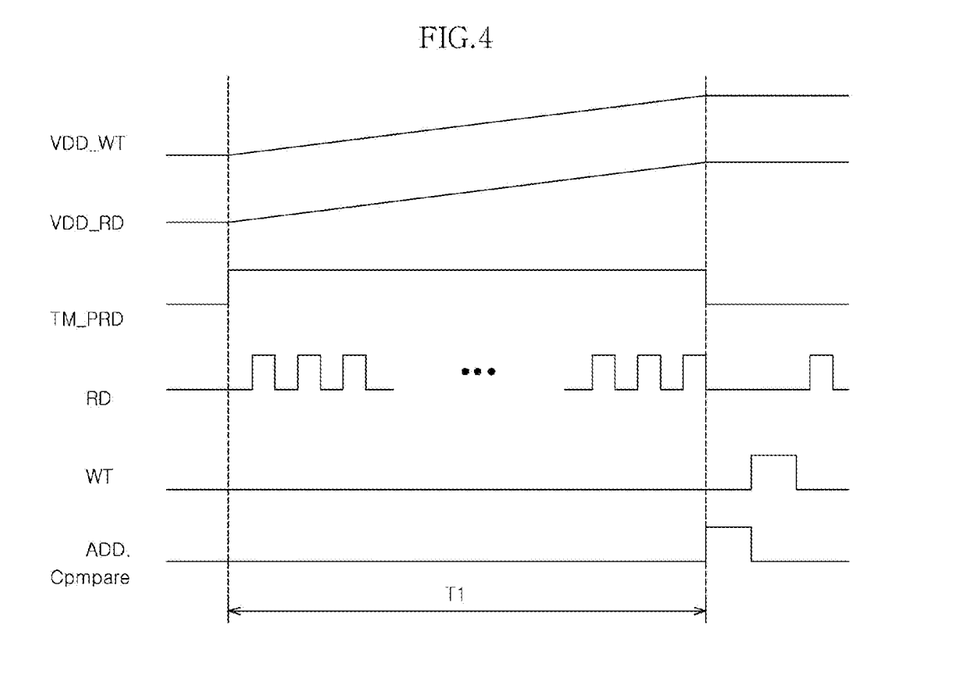
FIG. 4 is a timing diagram associated with an embodiment of the test method.

Referring to FIGS. 3 and 4, an embodiment of a test method will be described.

During the test mode, when the first external voltage is applied through the first pad 160 at step S101, the internal voltage generator 150 may generate the test read voltage VDD_RD and the test write voltage VDD_WT at step S103. The internal test voltage generation period T1 during which the test read voltage VDD_RD and the test write voltage VDD_WT are generated may be several μs.

While the test read voltage VDD_RD and the test write voltage VDD_WT are being generated, the second external voltage VEXT_RD may be applied to the read/write circuit 140 through the to second pad 170 at step S105. For this operation, the second external voltage application circuit 20 of FIG. 2 may apply the second external voltage VEXT_RD to the second pad 170 as the pre-read signal TM_PRD is enabled.

Then, the read/write circuit 140 may provide pre-read data PRD_DATA, corresponding to a result obtained by reading data of all of the memory cells in the memory cell array 110 in response to the second external voltage VEXT_RD and the read control signal RD received from the controller 180, to the controller 180 at step S107.

The controller 180 may generate the write control signal WT for selectively driving a write circuit unit in the read/write circuit 140 according to a result of a comparison between the pre-read data PRD_DATA and the test write data TEST_DATA, at step S109. The write circuit unit driven by the controller 180 may write the test write data TEST_DATA to the corresponding cell according to the test write voltage VDD_WT provided from the internal voltage generator 150, at step S111.

The read circuit units in the read/write circuit 140 may read data from all of the memory cells in the memory cell array 110 in accordance with the read voltage VDD_RD provided by the internal voltage generator 150 and the read control signal RD provided by the controller 180 to check the test result, at step S113.

During the pre-read operation by the second external voltage VEXT_RD or the test read operation by the first external voltage, data written in the memory cells in the memory cell array 110 may be read in a number of different ways. For example, the read circuit units may be sequentially electrically coupled to the respective bit lines of the memory cell array 110 to read data of each of the memory cells (read method for each bit line). In another example, the memory cells in the memory cell array 110 may be grouped in a unit of a plurality of bit lines, and data of the memory cells included in each of the groups may be sequentially read (read method for each group).

Figure 5:
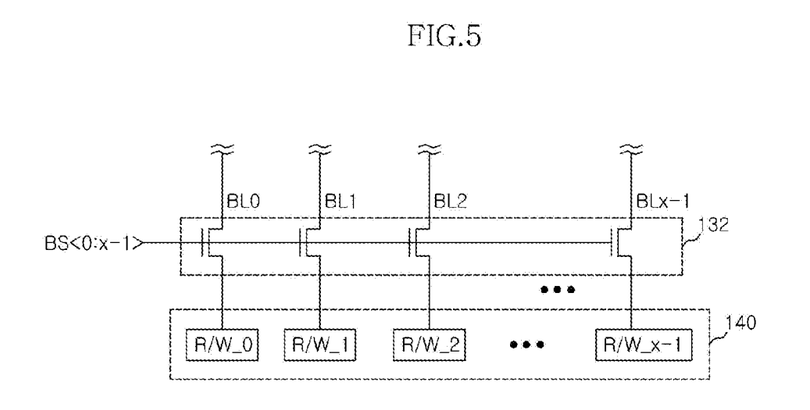
FIG. 5 is a circuit diagram used to explain an example of an embodiment of a read operation.

FIG. 5 is a circuit diagram used to explain an example of an embodiment of the read concept operation illustrating the read method for each bit line.

Each of the bit lines BL0-BLx-1 extending from memory cells may be electrically coupled to an associated unit read/write circuit unit R/W_0-R/W_x-1 in the read/write circuit unit 140. Whether the bit lines BL0-BLx-1 and the unit read/write circuit units R/W_0-R/W_x-1 are electrically coupled may be determined by the column select switch units 132 in the column selector 130 and are driven in response to column select signals BS<0:x-1>.

When the column select signals BS<0:x-1> are sequentially enabled during the pre-read operation or the test read operation, the bit lines BL0-BL_x-1 may be sequentially electrically coupled to the respective unit read/write circuit units R/W_0-R/W_x-1. Thus, the data in the memory cells that are electrically coupled to the bit lines that are electrically coupled to the respective unit read/write circuit units R/W_0-R/W_x-1 may be sequentially read via the read circuit to units.

Figure 6:
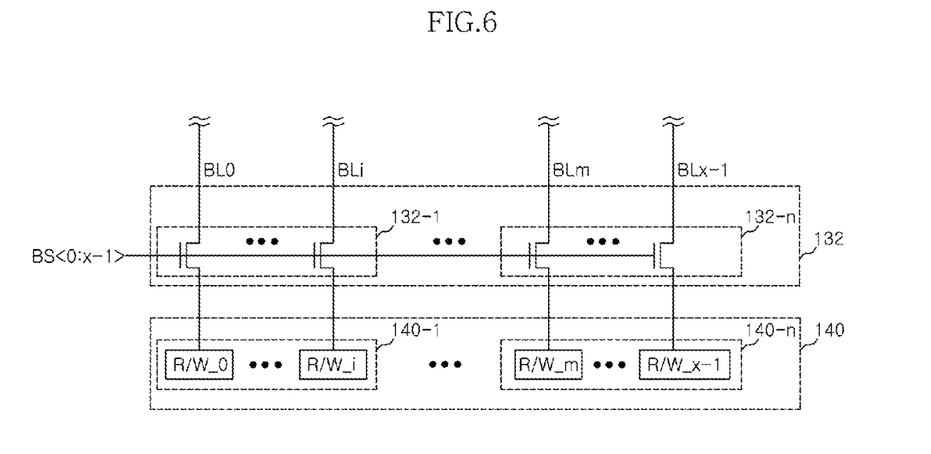
FIG. 6 is a circuit diagram used to explain another example of an embodiment of a read operation.

FIG. 6 is a circuit diagram used to explain another example of an embodiment of the read operation illustrating the read method for each group.

In an embodiment, the unit read/write circuit units R/W_0-R/W_x-1 may be grouped to form n groups, that is, read/write groups 140-1-140-n. The column select switch units 132 for electrically coupling the unit read/write circuit units R/W_0-R/W_x-1 to the bit lines BL0-BLx-1 extending from the memory cell array 110 may also be grouped to form n groups, that is, column select switch groups 132_1-132_n.

During the pre-read operation or the test read operation, the column select switch groups 132-1-132-n may be sequentially electrically coupled to the read/write groups 140-1-140-n, respectively, according to the corresponding column select signals BS<0:x-1>. Thus, the data in the memory cells that are electrically coupled to a plurality of bit lines that are electrically coupled to each of the read/write groups 140-1-140-n may be read at substantially the same time.

Figure 7:
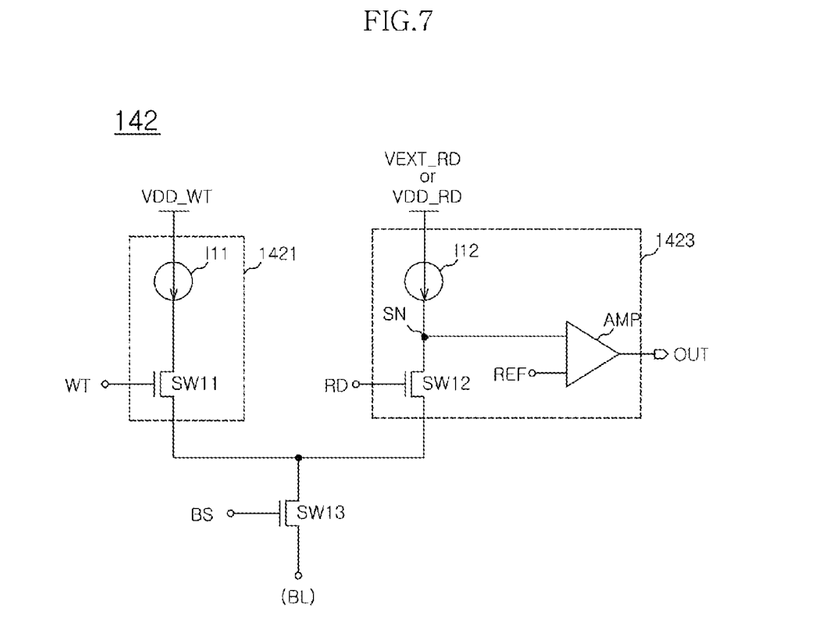
FIG. 7 is a circuit diagram used to explain an example of an operation of an embodiment of the unit read/write circuit unit.

FIG. 7 is a circuit diagram used to explain an example an embodiment of the unit read/write circuit unit.

The unit read/write circuit unit 142 may include a write circuit unit 1421 and a read circuit unit 1423.

The write circuit unit 1421 may include a first current source I11 and a switch SW11. The first current source I11 may receive the test write voltage VDD_WT and may responsively generate a write current during the test mode. The switch SW11 may be enable the flow of the write current to a bit line BL in response to the write control signal WT.

The read circuit unit 1423 may include a second current source I12, a switch SW12, and a sense amplifier AMP. The second current source I12 may receive the second external voltage VEXT_RD or the test read voltage VDD_RD and may responsively generate a read current during the test mode. The switch SW12 may be driven in response to the read control signal RD. The sense amplifier AMP may compare a voltage applied to a sensing node SN to a reference voltage REF, amplify the voltage, and output the amplified voltage as a read signal OUT.

Between the unit read/write circuit unit 142 and the bit line BL, the column select switch driven by the column select signal BS may be provided.

Alternative read methods in addition to those described with reference to FIGS. 5 and 6 may be used. While one example of a unit read/write circuit unit 142 has been described with reference to FIG. 7, alternative configurations of unit read/write circuits may be used.

Figure 8:
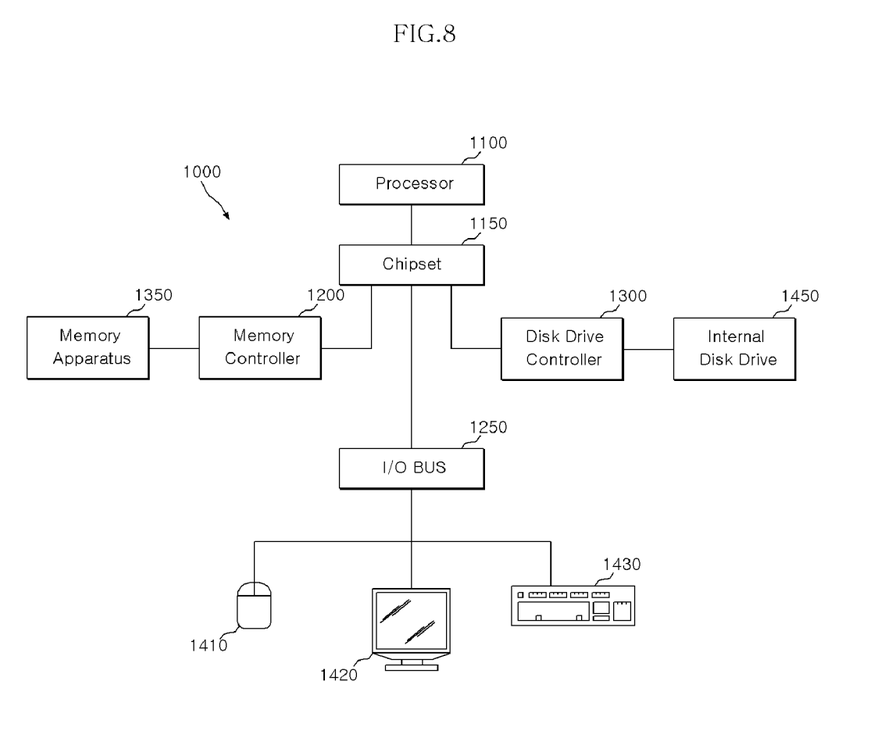
FIG. 8 is a block diagram representation of a system including an embodiment of the semiconductor memory apparatus.

Referring to FIG. 8, a block diagram representation of a system 1000 including an embodiment of a semiconductor memory apparatus 1350 is shown.

In an embodiment, a semiconductor memory apparatus 1350 may include a read/write circuit unit configured to receive an external voltage, to read data from a memory cell array, and to generate a pre-read signal while an internal voltage is generated during a test mode, and a controller configured to selectively drive a write circuit unit in response to the pre-read signal.

In an embodiment, a semiconductor memory apparatus 1350 may include an internal voltage generator configured to receive a first external voltage through a first pad and generate an internal voltage, a read/write circuit configured to generate a pre-read signal by reading data from a memory cell in a memory cell array in response to a second external voltage applied through a second pad during a test mode, and driven in response to a write control signal reflecting write circuit unit select information, and a controller configured to generate the write control signal reflecting the write circuit unit select information according to a comparison result between the pre-read signal and a test write signal during the test mode.

In an embodiment, a test method of a semiconductor memory apparatus 1350 including a memory cell array, a read/write circuit, an internal voltage generator, and a controller includes generating an internal voltage as a first external voltage is applied to the internal voltage generator through a first pad, during a test mode, generating, from the read/write circuit, a pre-read signal by reading data from memory cells in the memory cell array in response to the second external voltage, as a second external voltage is applied through a second pad, during the test mode, generating, from the controller, a write control signal reflecting write circuit unit select information according to a comparison result between the pre-read signal and a test write signal, and writing, by the read/write circuit, test write data to the memory cell array in response to the write control signal.

Examples of the semiconductor memory apparatus 1350 include, but are not limited to, dynamic random access memory, static random access memory, synchronous dynamic random access memory (SDRAM), synchronous graphics random access memory (SGRAM), double data rate dynamic ram (DDR), and double data rate SDRAM.

The memory controller 1200 is used in the design of memory devices, processors, and computer systems. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented A chipset 1150 may be electrically coupled to the CPU 1100. The chipset 1150 is a communication pathway for signals between the CPU 1100 and other components of the system 1000, which may include the memory controller 1200, an input/output ("I/O") bus 1250, and a disk drive controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be electrically coupled to the chipset 1150. The memory controller

1200 can receive a request provided from the CPU 1100, through the chipset 1150. In alternate embodiments, the memory controller 1200 may be integrated into the chipset 1150. The memory controller 1200 may be electrically coupled to one or more semiconductor memory apparatuses 1350. The semiconductor memory apparatuses 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The internal disk drive 1450 may also be electrically coupled to the chipset 1150. The internal disk drive 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

The system 1000 described above in relation to FIG. 8 is merely one example of a system employing a semiconductor memory apparatus 1350. In alternate embodiments, such as cellular phones or digital cameras, the components may differ from the embodiment shown in FIG. 8.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
   a read/write circuit unit configured to receive an external voltage, to read data from a memory cell array, and to generate a pre-read signal, while an internal voltage is generated during a test mode; and
   a controller configured to selectively drive a write circuit unit in response to the pre-read signal.

2. The semiconductor memory apparatus according to claim 1, wherein the controller is configured to selectively drive the write circuit unit according to a comparison result between the pre-read signal and test write data.

3. The semiconductor memory apparatus according to claim 1, wherein the external voltage is directly applied via a pad.

4. The semiconductor memory apparatus according to claim 1, wherein the pad comprises a data input/output pad, and
   the semiconductor memory apparatus further comprises an external voltage application circuit configured to provide the external voltage to the pad in response to the pre-read signal generated during the test mode.

5. A semiconductor memory apparatus comprising:
   an internal voltage generator configured to receive a first external voltage through a first pad and generate an internal voltage;
   a plurality of read circuit units configured to generate a pre-read signal by reading data from a memory cell in a memory cell array in response to a second external voltage applied through a second pad while the internal voltage is generated during a test mode,
   a controller configured to generate a write control signal reflecting a comparison result between the pre-read signal and a test write signal during the test mode; and
   a plurality of write circuit units configured to be selectively driven in response to the write control signal.

6. The semiconductor memory apparatus according to claim 5, wherein the plurality of write circuit units are configured to be selectively driven in response to the write control signal, and to write the test write signal to the memory cell array according to a write current generated based on the internal voltage.

7. The semiconductor memory apparatus according to claim 5, wherein the plurality of read circuit units are configured to read the data stored in the memory cell array according to a read current generated based on the internal voltage, and to generate a test read signal.

8. The semiconductor memory apparatus according to claim 5, wherein the controller is configured to generate a read control signal that is enabled to generate the pre-read signal, is disabled when the write control signal is generated, and then enabled to generate the test read signal.

9. The semiconductor memory apparatus according to claim 5, further comprising a second external voltage application circuit configured to provide the second external voltage to the second pad in response to the pre-read signal generated during the test mode.

10. The semiconductor memory apparatus according to claim 5, wherein the is plurality of read circuit units and the plurality of write circuit units are electrically coupled to the memory cell array through a plurality of bit lines, and the plurality of read circuit units sequentially reads data from the plurality of bit lines to generate the pre-read signal.

11. The semiconductor memory apparatus according to claim 5, wherein the plurality of read circuit units are divided at least one group, wherein each of the at least one group has a designated number of read circuit units electrically coupled to an associated bit lines, and sequentially read data from each of the at least one group to generate the pre-read signal.

12. A test method of a semiconductor memory apparatus including a memory cell array, a read/write circuit, an internal voltage generator, and a controller, comprising:
   generating an internal voltage as a first external voltage is applied to the internal voltage generator through a first pad during a test mode;
   generating, from the read/write circuit including a plurality of read circuit units and a plurality of write circuit units, a pre-read signal by reading data from a memory cell in the memory cell array in response to a second external voltage, as the second external voltage is applied through a second pad while the internal voltage is generated during the test mode;
   generating, from the controller, a write control signal reflecting a comparison result between the pre-read signal and a test write signal; and writing, by the plurality of write circuit units selectively driven in response to the write control signal, test write data to the memory cell array.

13. The test method according to claim 12, wherein the pre-read signal is generated while the internal voltage is generated.

14. The test method according to claim 12, wherein generating the pre-read signal and generating the write control signal occur while the internal voltage is generated.

15. The test method according to claim 12, wherein writing the test write data to the memory cell array is performed according to a read current generated based on the internal voltage.

16. The test method according to claim 12, further comprising reading, by the plurality of read circuit units, data from the memory cell in the memory cell array and generating a test read signal, after writing the test write data to the memory cell array.

17. The test method according to claim 12, wherein generating the pre-read signal comprises sequentially reading data from a plurality of bit lines that electrically couple the plurality of read circuit units to the memory cell array.

18. The test method according to claim 12, wherein the plurality of read circuit units are divided at least one group, wherein each of the at least one group has a designated number of read circuit units electrically coupled to an associated bit line, and generating the pre-read signal comprises sequentially reading data from each of the at least one group.

* * * * *